(12) United States Patent
Gullapalli

(10) Patent No.: US 6,424,076 B1
(45) Date of Patent: Jul. 23, 2002

(54) INCREMENTAL SWITCHED DEFORMABLE MIRROR

(75) Inventor: Sarma N. Gullapalli, Bethel, CT (US)

(73) Assignee: The B. F. Goodrich Company, Charlotte, NC (US)

(*) Notice: Subject to any disclaimer, the term of this patent is extended or adjusted under 35 U.S.C. 154(b) by 0 days.

(21) Appl. No.: 09/168,364

(22) Filed: Oct. 7, 1998

(51) Int. Cl.[7] ............................................... H01L 41/04
(52) U.S. Cl. ...................................... 310/328; 310/317
(58) Field of Search ................................ 310/317, 328; 359/223, 224, 290, 291

(56) References Cited

U.S. PATENT DOCUMENTS

| | | | | | |
|---|---|---|---|---|---|
| 4,311,986 A | * | 1/1982 | Yee | ..................... | 340/825.63 |
| 4,372,274 A | * | 2/1983 | Takase | ..................... | 123/491 |
| 5,834,871 A | * | 11/1998 | Puskas | ..................... | 310/316 |
| 5,870,076 A | * | 2/1999 | Lee et al. | ..................... | 345/149 |
| 5,945,769 A | * | 8/1999 | Mitarai et al. | ..................... | 310/317 |
| 5,986,795 A | * | 11/1999 | Chapman et al. | ..................... | 359/224 |
| 6,137,622 A | * | 10/2000 | La Fiandra | ..................... | 359/290 |
| 6,181,051 B1 | * | 1/2001 | Puskas | ..................... | 310/316.01 |

FOREIGN PATENT DOCUMENTS

| | | | |
|---|---|---|---|
| JP | 57-076245 | * | 5/1982 |
| JP | 57-143133 | * | 9/1982 |
| JP | 62-175815 | * | 8/1987 |
| JP | 07-141028 | * | 6/1995 |

\* cited by examiner

*Primary Examiner*—Nicholas Ponomarenko
*Assistant Examiner*—Peter Medley (57) ABSTRACT

A method of driving a plurality of actuators comprising the steps of providing a plurality of actuators and a controller having drive output signals for driving said plurality of actuators. At least one multiplexer is provided between said controller and said plurality of actuators and driving said actuators using said controller drive output signals by causing said actuators to be energized and deenergized by mutiplexing through said multiplexer.

17 Claims, 12 Drawing Sheets

INCREMENTAL SWITCHED DEFORMABLE MIRROR

BACKGROUND OF THE INVENTION

The present invention relates to an incremental switched deformable mirror (DM) drive which uses analog multiplexers to drive more than one actuator with the same drive amplifier. In practically all known applications of the deformable mirror, the purpose of using the deformable mirror is to provide correction for the phase distortions of the input wavefront, the cause of the input phase distortions being due to one or more of the following (a) atmospherics and other turbulences (b) thermally induced deformations of optical elements (c) gravity effects and (d) static deformations of optical elements. The statistics governing the DM drive requirements are very nearly the same as the spatial and temporal statistics of the input wavefront, since the DM attempts to exactly correct the input wavefront, except that the required DM amplitude is 0.5 times that of the input, due to the doubling of the optical path due to reflection. Except for (a) above, all the others involve very low temporal frequencies, and so at typical sampling frequencies, the incremental drive per sample period is much smaller than the input. What is not obvious, and this is shown below, is the fact that this is true even for the spatial and temporal frequencies involved in the atmospherics.

It is desirable to provide a system applicable to any deformable mirror (DM) drive system, and so is useful in any and all of the adaptive optics systems that use deformable mirrors. To illustrate the need to have such a system applicable to a wide range of requirements, design examples are given for two extreme cases of requirements as follows.

(a) high sampling rate (5 kHz) and high Greenwood frequency (few hundred Hz, depending on strehl error budget allocated to the servo loop), and (b) low sampling rate (100 Hz) and low equivalent "Greenwood frequency" (few tenths of Hz, such as due to thermal deformations or mirrors).

The sampling rate could be made higher than 5 kHz, depending on system parameters;

The above extreme case requirements are only examples, and should not be taken as an inherent design limit.

In the analysis that follow, use is made of standard formulae that are widely used and accepted as good approximations for the temporal and spatial statistics of the atmospheric phase variations. In particular, the Greenwood frequency is used as a measure of the temporal frequency content of the input, with a few hundred Hz denoting the high end of temporal requirements, and a very low value of a few tenths of a Hz to represent the temporal content of all other effects. In the high frequency cases, the servo bandwidth is derated (multiplied) by a factor of 0.5, in order to account for the fact that the standard formulae do not include the effects of some of the finer details of the servo loop.

Thus, these two extreme cases effectively cover all possible known applications.

All known prior art uses involve one drive amplifier per actuator. There are many examples of this prior art: SAAO, SOR, LAMP, ABL, etc. Such systems are inefficient, as will be shown in the analysis supporting this invention.

Accordingly, it is an object of the present invention to provide an Incremental Switched Deformable Mirror Drive System for a Deformable Mirror (DM) with significantly fewer drive amplifiers without significantly lowering the drive update frequency (bandwidth).

Another object of the invention is to provide an Incremental Switched Deformable Mirror Drive System of the aforementioned type which significantly reduces the volume, weight and power consumption of the drive amplifier electronics, particularly for air-borne and space-based systems.

Yet still a further object of the invention is to provide a system of the aforementioned type which significantly improves hardware reliability by reducing the cabling and number of electrical connections thereto in systems with very large number of actuators and/or high spatial density of actuators, for which conventional one-drive-per-actuator drive system results in almost impossible cabling, connector and power requirements.

Yet still a further object of the invention, is for use in low bandwidth systems allowing for achieving large stroke with relatively low voltage drive.

It is a further object of the invention to accomplish the multiplexing of actuation in a manner which is consistent with the operational requirements of deformable mirror systems in typical applications in both low frequency and high frequency systems, resulting in potential significant savings in power, volume, opening up new design parameters.

A further object of the invention is to provide manufacturing concepts which are introduced for arrangement of deformable mirror actuator arrays, and for high density actuator arrays, leading to distributed two-dimensional actuators.

SUMMARY OF THE INVENTION

The invention resides in a method of driving a plurality of actuators comprising the steps of providing a plurality of actuators and a controller having drive output signals for driving said plurality of actuators. At least one multiplexer is provided between said controller and said plurality of actuators and driving said actuators using said controller drive output signals by causing said actuators to be energized and deenergized by mutiplexing through said multiplexer.

Ideally a drive amplifier is provided between said plurality of actuators and said controller and said drive amplifier is used in conjunction with said at least one multiplexer to drive said plurality of actuators.

In one embodiment, a comparator is provided as part of said drive amplifier and is used as a switch, while in another embodiment a plurality of multiplexers is used with the drive amplifier and are configured with said drive amplifier to effect a continuous drive.

Preferably, the plurality of actuators are arranged in an array and are piezoelectric type actuators, and the controller has a limit drive min/max function as well as the controller being provided with a monitoring function which detects and limits differential stroke between actuators.

Ideally said plurality of actuators are located on one side of a board and a plurality of multiplexers are mounted on the other side of said board in a wing like configuration.

The multiplexers may be arranged in a stacked arrangement.

DETAILED DESCRIPTION OF THE PREFERRED EMBODIMENT

It is generally accepted that the spatial variance of the atmospheric phase is characterized by the Kolmogorov spectrum, and is given by:

$$D\phi(x, r0) = 6.68 * (|x|/r0)^{5/3} \text{radian} \quad (1)$$

where r0=coherence length x=spatial separation of two points for which this variance is the value.

Over a time interval of T seconds, where T=1/fs, fs being the sampling frequency (Hz), given an effective wind velocity of vw meters/sec, the three sigma value of the phase variation seen in one sample period is therefore given by $$\phi(vw, fs, r0) = 3*\text{sqrt}(6.88*(vw/(r0*fs))^{5/3}) \text{radian} \quad (2)$$

Here, the "frozen atmosphere" assumption is made, which is again widely accepted in the industry as being valid over small time intervals.

In a typical servo design, the sampling frequency is determined by the servo bandwidth, which in turn is determined by the error budget allocated for the residual wavefront error after servo correction is applied. The phase variance of the residual wavefront after correction by the servo is given by $$(\sigma_r)^2 = (0.4*vw)/(r0*fc) \text{ radian}^2 \quad (3)$$

where fc=servo bandwidth (Hz)

Since this is an approximate formula that does not take into account some of the finer details of the servo rejection, a conservative derating factor of 0.5 is applied to fc, to get $$(\sigma_r)^2 = (0.4*vw)/(r0*0.5fc) \text{ radian}^2 \quad (3a)$$

If str=the strehl allocated for the residual error due to servo, then $$str = \exp(-((\sigma_r)^2)) \quad (4)$$

This formula is valid for the range of strehls (>about 0.2) usually budgeted for servo.

Also, typically, the sampling frequency is chosen to be about 10 to 20 times larger than the servo bandwidth, $$fs = nfc*fc \quad (5)$$

where nfc=a factor in the range 10 to 20

From equations (2), (3a), (4) and (5), it is found that the 3 sigma value of the phase variation over one sample interval is a function only of the strehl budgeted for servo residual and the factor nfc, $$\sigma(str, nfc) = 9.476*((1/nfc)*\ln(1/str))^{5/6} \text{ radians} \quad (6)$$

If the derating factor is not applied to servo bandwidth, it means that the servo is more effective and so a larger incremental phase per sample is tolerated, and so the incremental phase per sample is actually larger given by $$\sigma(str, nfc) = 16.886*((1/nfc)*\ln(1/str))^{5/6} \text{ radians} \quad (6a)$$

In the design calculations for the drive electronics that follow, to be conservative, the larger value given by (6a) will be used, while the derated servo bandwidth will be used when computing the maximum allowable Greenwood frequency.

On the other hand, the stroke requirement (a 3 sigma value) of the DM is given by $$sdm = 3*\text{sqrt} (0.134*(D/r0)^{5/3}) \text{ radians} \quad (7)$$

for the piston and tilt removed case (if tilt is not removed, it is even much higher), where D=aperture diameter.

Figure 1:
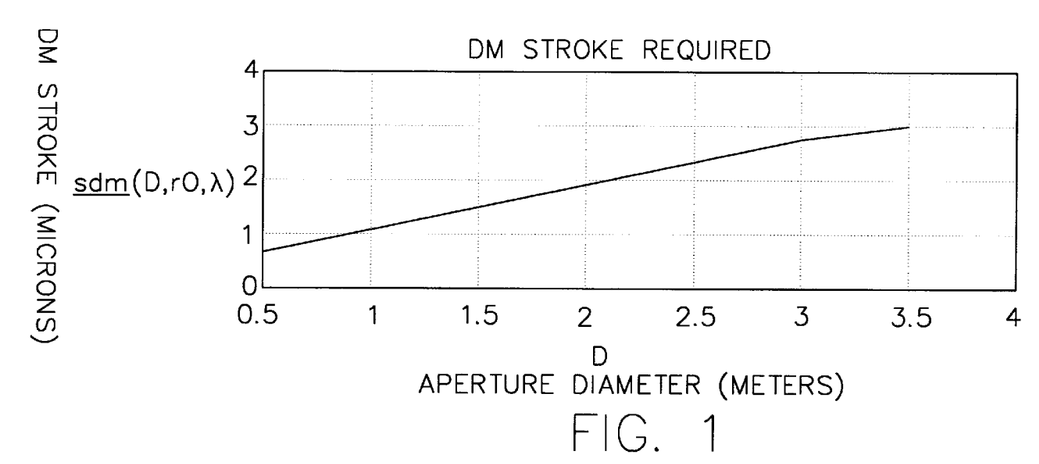
FIG. 1 is graph of the deformable mirror stroke requirements, for ro=0.05 m; λ=1 micron.
Figure 2:
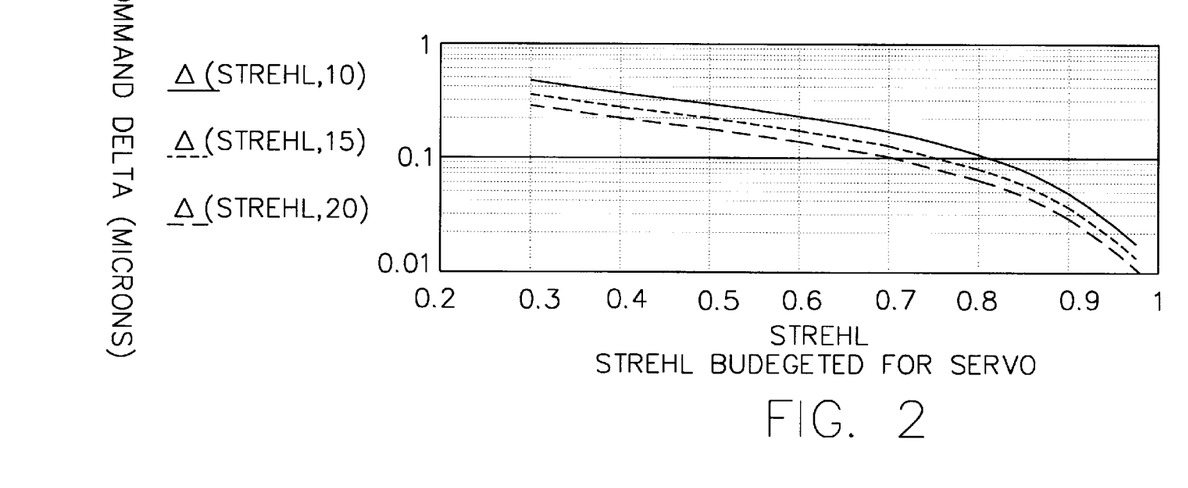
FIG. 2 is graph of deformable mirror command delta values versus strehl budgeted for servo, for sampling frequency/servo bandwidths=10, 15 and 20.

For illustration, for r0=0.05 meters and λ1 micron, the stroke requirement is shown in FIG. 1 as a function of aperture diameter. This shows the stroke requirement is typically of the order of 1 to 3 microns, for tilt removed case. If tilt is not removed or not fully removed, the stroke requirement will be even higher, typically of the order of 2 to 6 microns. On the other hand, the incremental phase requirement, shown in FIG. 2 (for the same r0) as a function of strehl budgeted for servo, is only in the range of a few tenths of micron, about an order of magnitude smaller than the stroke requirement.

The Greenwood frequency is now related to the servo parameters and the strehl budgeted to servo. The Greenwood frequency is given by $$fg = 0.4*vw/\text{sqrt}(\lambda*L) \quad (8)$$

where λ is wavelength (meters), L is the atmospheric path length (meter) and vw in the effective wind velocity (m/sec), and $f_g$ is in $H_z$ combining this with equation 3a and 4, it is arrived at, including the derating factor of 0.5 for servo bandwidths, $$f_g = l_n(1/str)*r_o*f_s*0.5/\text{Sqrt}((\lambda*L)*nfc) \quad (8a)$$

Figure 3:
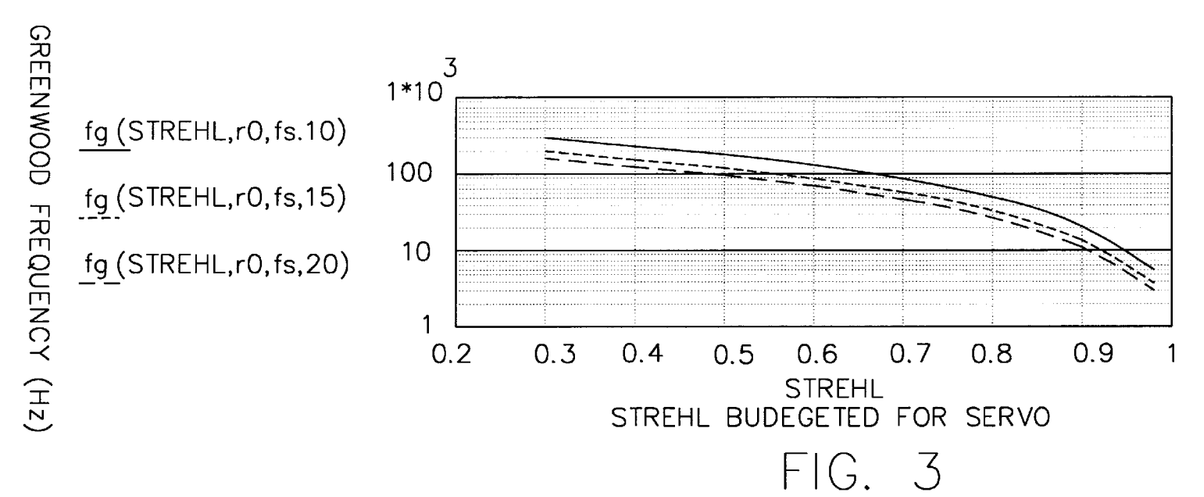
FIG. 3 is a graph of allowable Greenwood frequency and strehl values budgeted for servo, for high sampling rate case (1 kHz), for ro=0.05 m, λ=1 micron, sampling frequency/ servo bandwidth=10, 15 and 20, with 0.5 servo derating factor.
Figure 4:
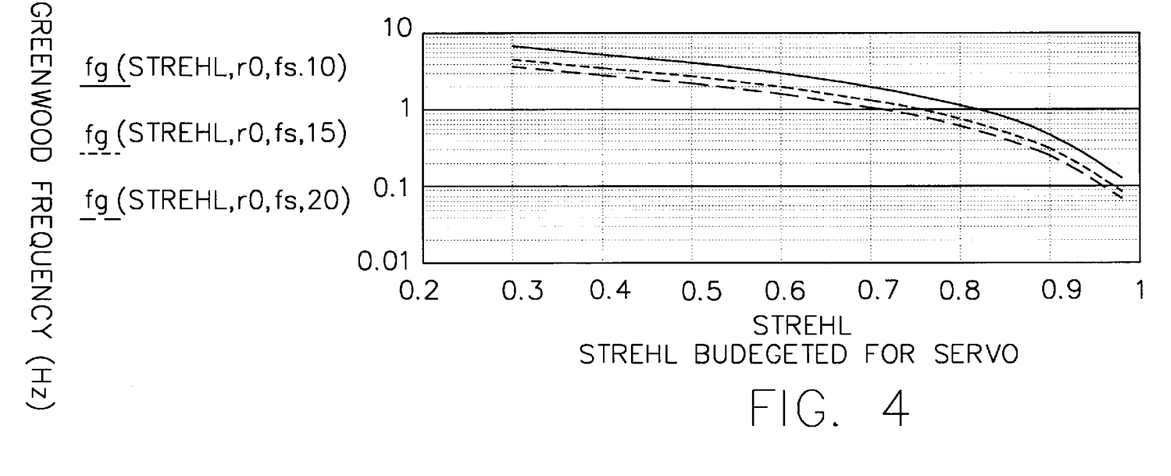
FIG. 4 is a graph of allowable Greenwood frequency and strehl values budgeted for servo, for low sampling rate case (100 Hz), for ro=0.05 m, λ=1 micron, sampling frequency/ servo bandwidth=10, 15 and 20, with 0.5 servo derating factor.

For r0=0.05 meters and λ=1 micron, sampling frequency fs=5 kHz, L=10 km, the maximum allowed Greenwood frequency is shown in FIG. 3 as a function of strehl budgeted for the servo. These servo parameters are designed to handle the high Greenwood frequency cases (a few hundred Hz). For the same parameters, except that the sample frequency is 100 Hz, the maximum allowable Greenwood frequency is shown in FIG. 4, and this will serve as an example of the low bandwidth deformable mirror drive design.

The consequences of this fact (that the incremental DM drive required in one sample period is a small fraction of the stroke requirement) are: (a) the drive current requirement is correspondingly small, or, equivalently, (b) for a given drive current capability of the drive amplifier, much smaller time is needed to drive the actuator (for given tolerances). Therefore, this fact can be exploited to multiplex the drive amplifier to more than one actuator, thereby drastically reducing the number of drive amplifiers required. The analog switches are small, and dissipate very little power compared to the drive amplifiers, and so there is a large saving in power, and savings in weight and volume also. For example, for a deformable mirror with 900 actuators, typical conventional design requires several racks of drive electronics dissipating more than 10 kilowatts of power. Even multiplexing just two actuators to one drive amplifier reduces this by a factor of almost half. Moreover, the switched drive allows faster charging of actuator capacitance, at the maximum allowed drive current, as explained in a later section, instead of the exponential charging of conventional continuous drive. (The additional latency due to multiplexing is small, as shown later).

Figure 5A:
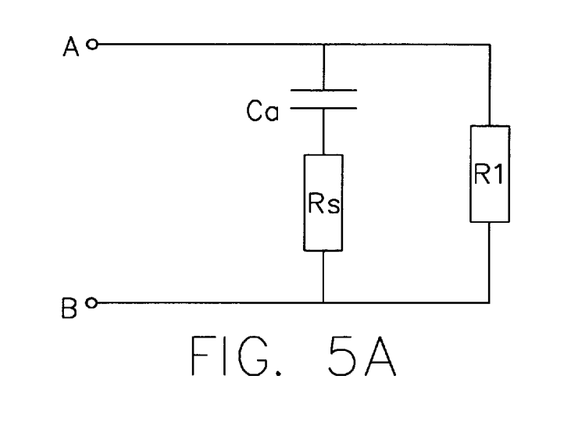
FIG. 5a is an equivalent circuit of an actuator.
Figure 5B:
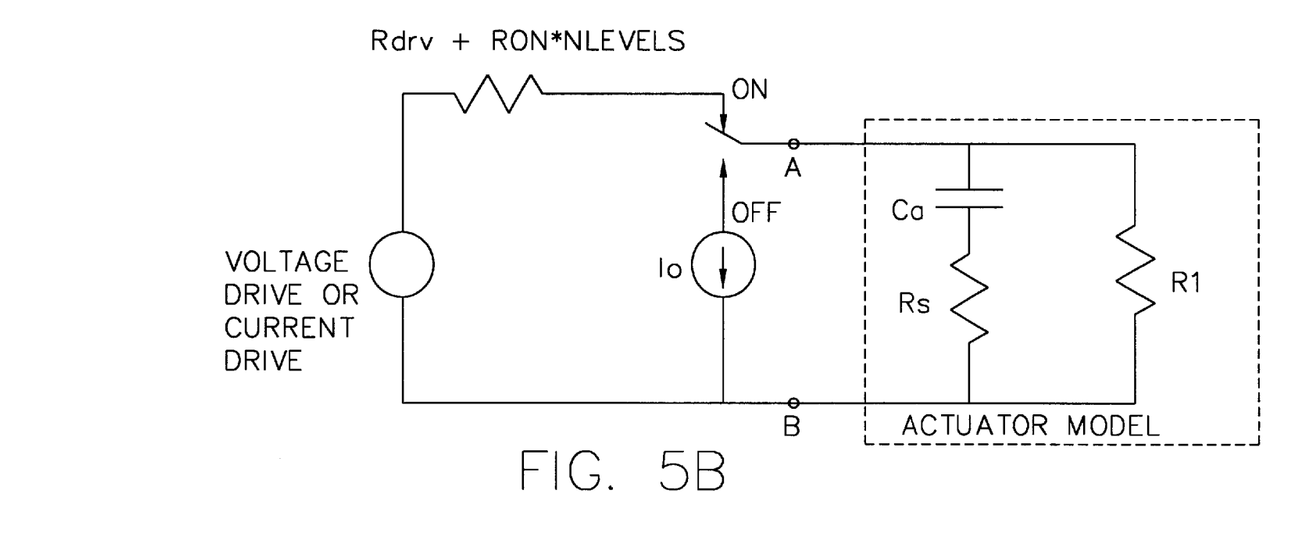
FIG. 5b is a schematic of the circuit which includes multiplexed drive and the actuator shown in FIG. 5a, for low bandwidth cases.

The invention can be understood by an analysis of the switched drive electronics, to show that high bandwidth cases can be handled with multiplexed actuators; and analysis of low bandwidth systems. The electrical equivalent circuit of a typical deformable mirror actuator is shown in FIGS. 5a, 5b. It is characterized by three parameters: (a) the capacitance Ca (typical value is about 1 $\mu$f, (b) the leakage resistance Rl (typical value is about $10^9$ ohms, and (c) the series resistance due to leads and hysteresis power loss in the actuator, Rs (typical value is about 100 ohms). Note that typical charging time constant (which must include drive amplifier series resistance) is therefore about 100 $\mu$sec or larger. As shown in examples below, for a maximum (peak) drive current of 0.4 amp (which is taken from an existing drive amplifier design), the charging time for the switched drive is only about 10 to 20 $\mu$sec, which is much faster. The slew rate of the drive amplifier is typically several hundred volts per $\mu$sec, and so that is not a limiting factor. This novel switched drive amplifier design opens up a new trade space between internal power dissipation and peak drive current, which can result in even shorter switch ON times.

Figure 6:
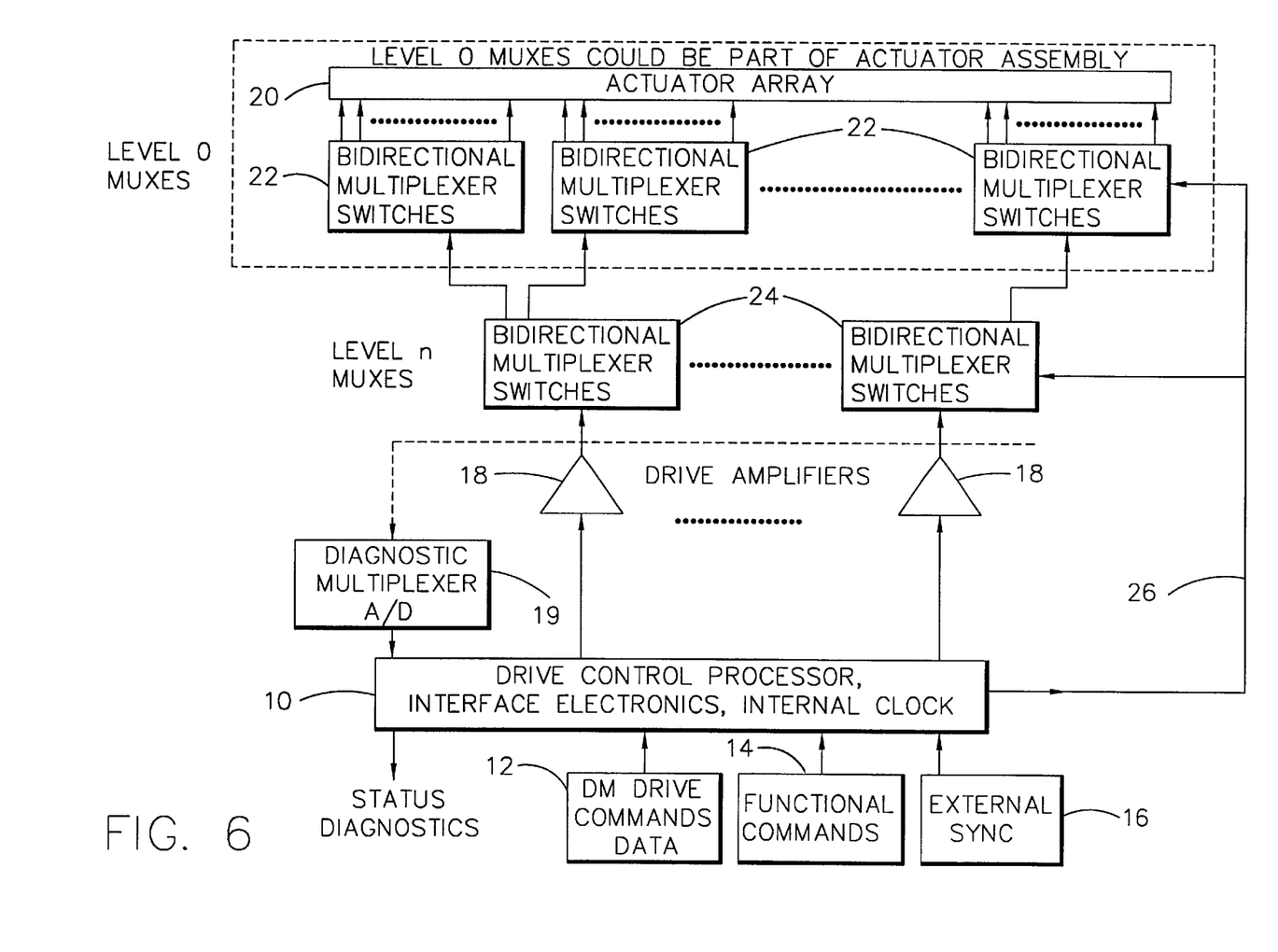
FIG. 6 shows the drive scheme of the invention.

In accordance with the invention, a multiplexing actuator driver scheme is illustrated generally at 20 in FIG. 6. The scheme includes a drive control processor (DCP) 10, to which is inputted mirror drive commands 12, functional commands 14 and external synchronizing pulses 16, and a diagnostic multiplexer 19. A plurality of piezoelectric actuators formed from stacked segments are disposed in an array 20 and are driven directly by a plurality of level 0 bidirectional multiplexer switches 22,22. Drive amplifiers 18,18 are coupled between the DCP level n bidirectional multiplexer switches 24,24. An address line 26 couples the aforementioned components with one another with an appropriate timing logic.

It should be understood that when a multiplexed drive is used, there is inevitably a ripple error due to charging during ON time and leakage during OFF time. For example, the switched drive, shown in FIG. 7 for high bandwidth cases and explained below, will have a negligible charging error. However, for low bandwidth cases such as shown in FIG. 8, the speed of the switched drive is not necessary, and the simpler continuous drive amplifier may be used, in which case the charging error is made small by allowing the ON time to be about 4 time constants. On the other hand, during OFF period, leakage occurs not only through the (very high, ~$10^9$ ohms) leakage resistance of the actuator itself, but also through the OFF state leakage current of the multiplexer switch. These considerations lead to two basically different multiplexing switch designs, for the high and low Greenwood frequency (equivalently high and low bandwidth) cases as will be discussed with reference to FIGS. 7 and 8.

Figure 7:
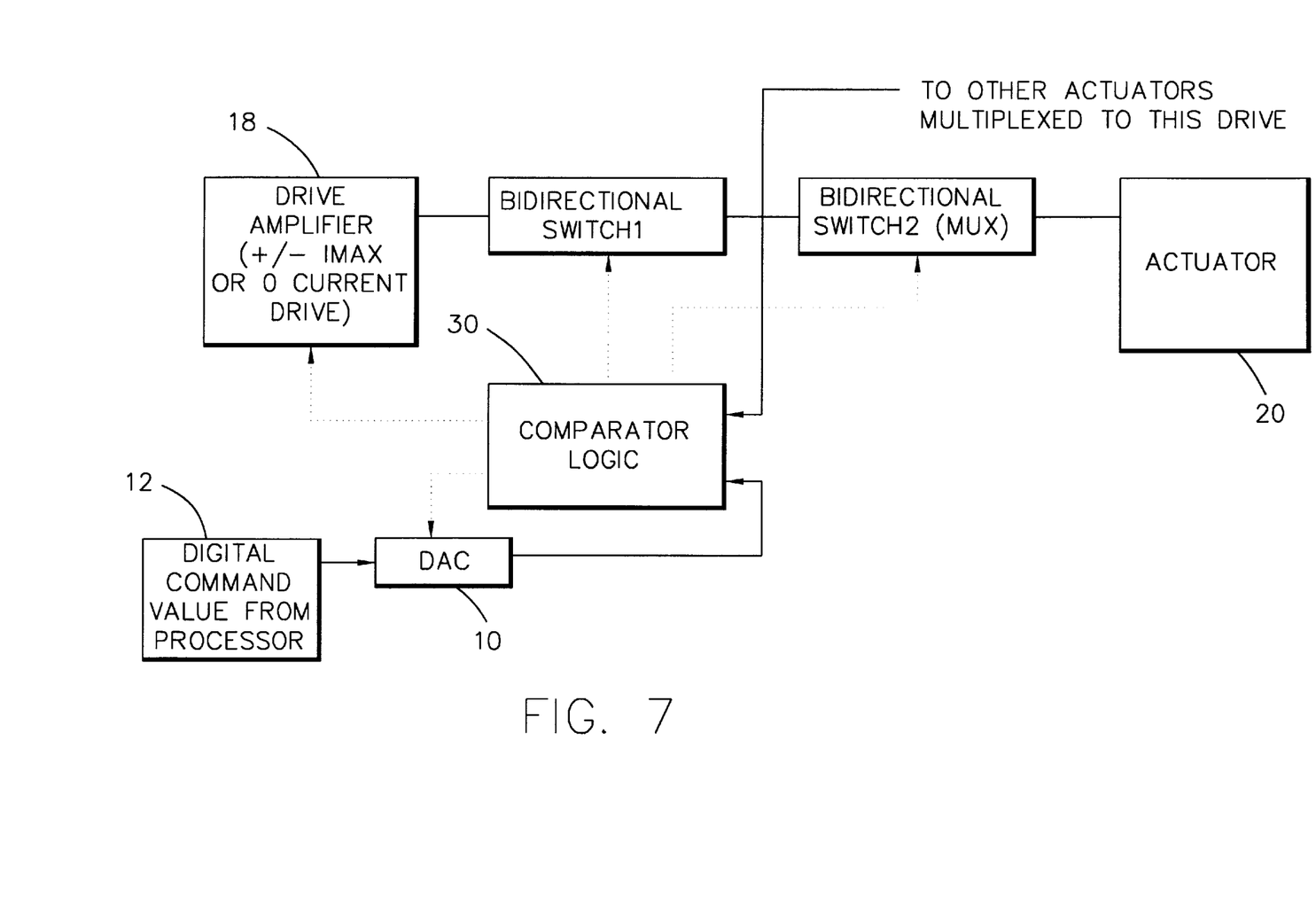
FIG. 7 shows one embodiment of a multiplexer driver for high bandwidth case.
Figure 8:
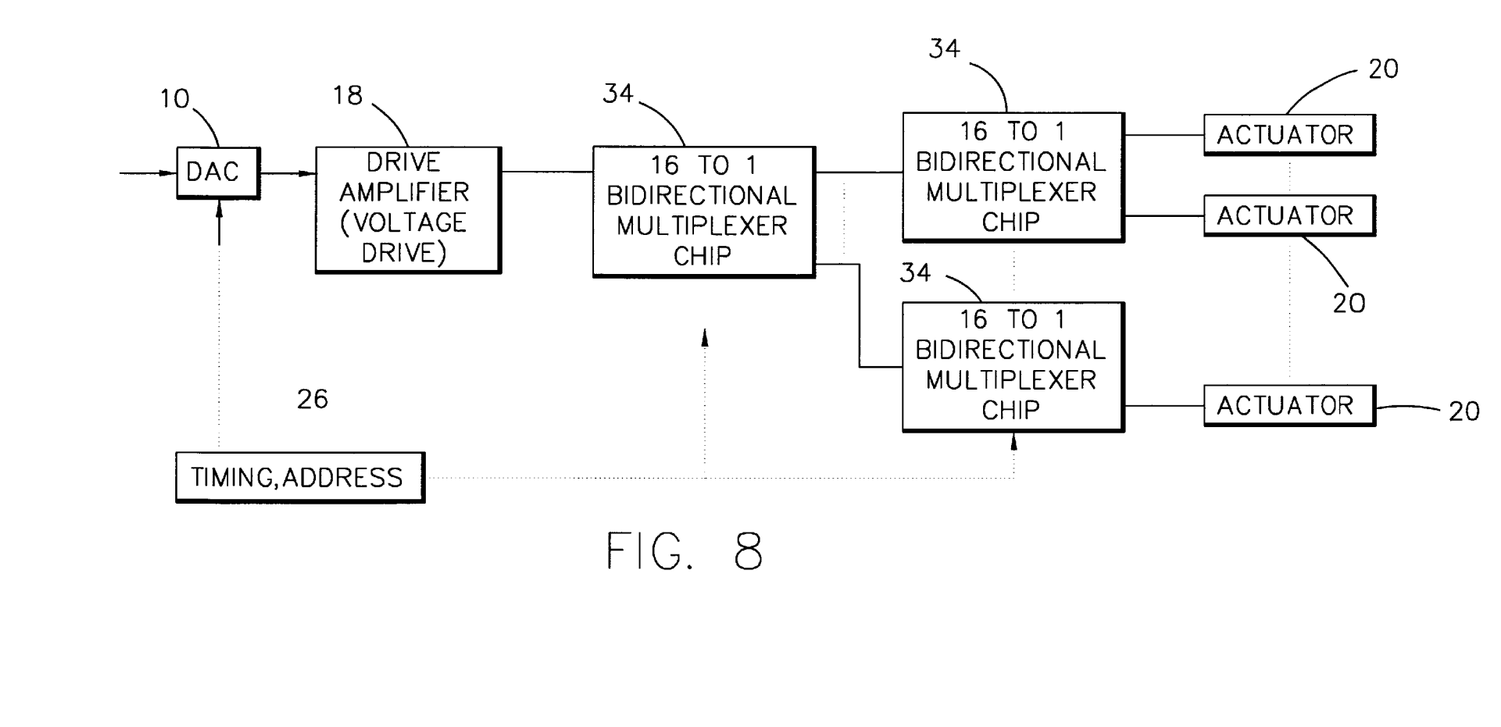
FIG. 8 shows one embodiment of a multiplexer driver, for low bandwidth case.

For the high bandwidth case as shown in FIG. 7, because the OFF time is very small (high sampling rate), the leakage current of the switch is not the driver; the ON current capacity is the driver. Also, due to the low degree of multiplexing allowed by high sampling rate, depending on the stroke requirements, sufficiently large voltage drive may also be required. The off-the-shelf device that meets these requirements is the power MOSFET that is commonly used in motor drive electronics. Such a device, for example, would have an ON resistance of a fraction of ohm, have 250 $\mu$amp leakage current in OFF state (Vgs=0), and have a very high current capacity (few amps) and high voltage handling capacity.

As shown in FIG. 7, each drive amplifier 18 includes a comparator 30 for controlling turning ON or OFF of the drive actuators which are multiplexed to the amplifier. The voltage comparator 30 switches the drive amplifier on and off, and the drive amplifier is designed as a current drive, delivering maximum current when it is ON. This minimizes the switch ON time. With custom packaging with several such switches and associated logic drive circuits in one package, the volume and weight can be reduced even further.

Figure 9:
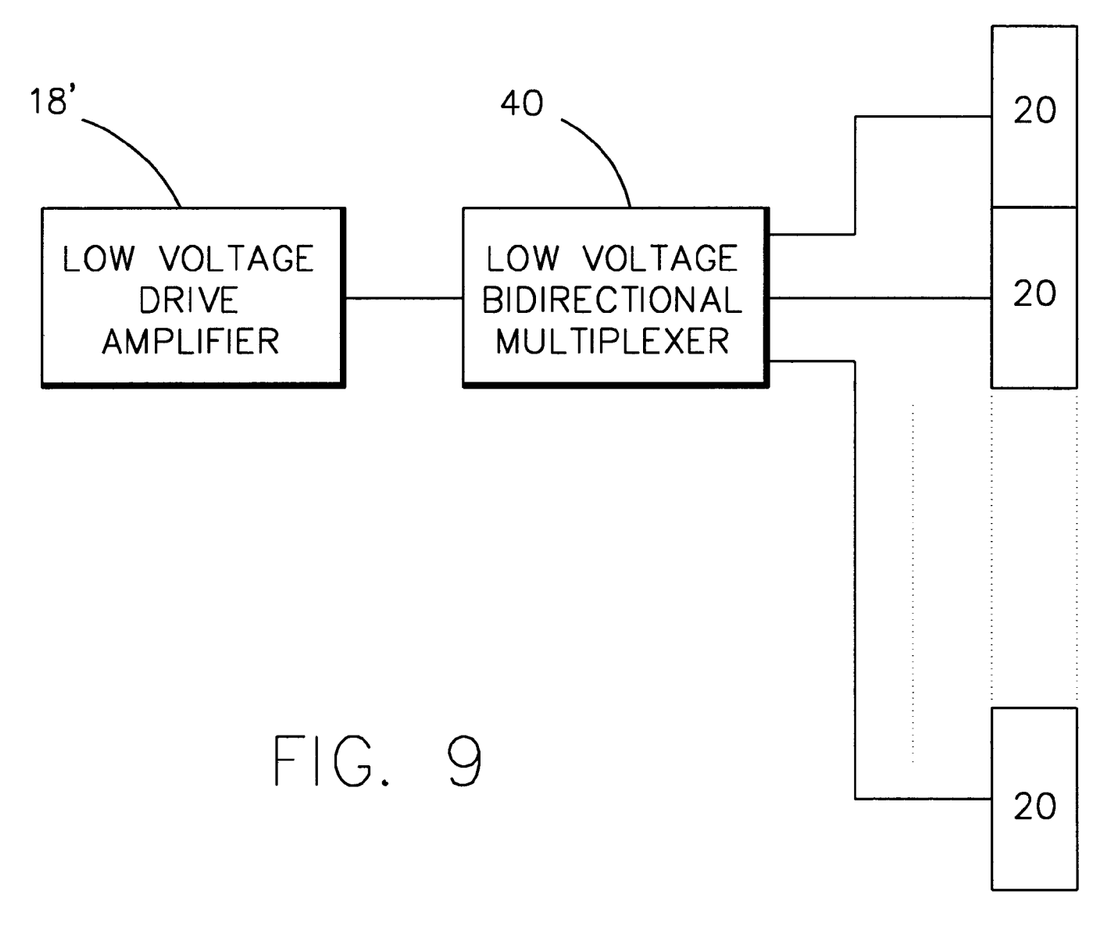
FIG. 9 shows a stacked actuator driver scheme, for large stroke, low voltage drive.

Alternatively, as shown in FIG. 8, for low bandwidth cases, since the sampling frequency is low, charging time is not critical, but the leakage during long OFF time is the driver (high degree of multiplexing, such as 32 or 64 actuators to one drive amplifier, requires longer OFF times). Typical analog multiplexers 34,34 used in data acquisition systems are commercially available with 8 or 16 channels multiplexed in one chip, with ON resistance of about 200 ohms, and OFF leakage current of about 10 nAmps. But such multiplexers can handle only about 30 volts (over+/−15 volts), which is equivalent to about 1 micron stroke of the actuator, and their current carrying capacity is limited to about 30 mA peak. However, since the low bandwidth cases permit high degree of multiplexing, it is possible to obtain n times larger stroke by dividing the single actuator's electrical drive into n stacked segments, and multiplexing these segments. By using custom packaging, the volume of these multiplexers can be made even smaller as illustrated in FIG. 8. An alternative stacked drive arrangement for low bandwidth larger stroke requirements is shown in FIG. 9.

Ripple Error Due to Multiplexing

Ripple error has been taken into account for the various components of the system and for the different cases which are involved.

(a) Error During Switch ON Time

For the (high bandwidth case) switched drive, the error is due to the finite comparator sensitivity threshold. The resulting error is given by $$\epsilon 1 = \delta V * Ka \qquad (9)$$

where
- Ka is the actuator gain (microns per volt) which is typically about 0.03 microns per volt
- δV is the comparator threshold error, which can be easily made smaller than about 0.05 volt.
- Thus the typical peak error is only about 0.0015 microns which is negligible.

For the (low bandwidth) unswitched case, for a given incremental drive signal of φ microns in one sample period, the peak error due to incomplete charging of the actuator capacitor is given by $$\epsilon 1 = \phi * \exp(-Ton/\tau) \text{ microns} \quad (10)$$

where
- Ton=switch ON time; τ=charging time constant=Ca*(Rs+Rdrv+NL*Ron);
- Ca=Actuator capacitance
- Rs=Actuator lead resistant
- Rdrv=Drive amplifier series resistance
- Ron=Multiplexer switch ON resistance per switch
- NL=Number of levels of multiplexers used For φ=0.1 micron and (Ton/τ)=4, the error is only 0.0018 microns which is negligible.

(b) Error During OFF Time, Due to Leakage

The peak value of the voltage drop during the OFF time is bounded by $$\epsilon 2 = (Io + Vmax/Rl) * Toff * ka/Ca \text{ microns} \quad (11)$$

where
- Io=switch leakage current
- Vmax=maximum drive voltage (for full stroke)
- Rl=actuator leakage resistance (~$10^9$ ohms)
- Toff=switch OFF time
- Ka=actuator gain (~0.03 microns per volt)
- Ca=Actuator capacitance (~1 $\mu$farad)

For the high bandwidth case, for Vmax=100 volts, Io=250 $\mu$ramp, Toff~200 $\mu$sec (5 kHz sampling), this error is only 0.0015 microns which is negligible.

For the low bandwidth case, for Vmax=30 volts, Io=10 nAmp, Toff~0.1 sec (10 Hz sampling), this error is only 0.00012 microns which is negligible. (Even with 4 stages stacked per actuator for 4 microns stroke, the error is still only a negligible 0.000.48 microns).

The peak-to-peak ripple is bounded by ($\epsilon 1 + \epsilon 2$), and so the peak ripple error is less than 0.5* ($\epsilon 1 + \epsilon 2$), which is negligible as shown above. Thus, the ripple error is negligible.

The Switch ON Time and Additional Latency for the High Bandwidth Case

The switch ON time and additional latency are not critical for the low bandwidth case. However, from equation (6a), the 3 sigma value of phase variation in one sample time is given by φ(str, nfc)=16.886* (1/nfc)*ln(1/str))$^{5/6}$ radians, and so, for wavelength of λ, the 3 signal change in DM drive command in one sample time is given by $$\Delta(str, nfc, \lambda) = 16.886 * ((1/nfc) * \ln(1/str))^{5/6} * (10^6/\lambda) \text{ microns} \quad (12)$$

and the switch ON time is given by $$Ton(str, nfc, \alpha) = 16,886 * ((1/nfc) * \ln(1/str))^{5/6} * (10^6/\lambda) * Ca/(Ka * Imax) \quad (12a)$$

where Imax is the maximum allowed current through the switch (and the drive amplifier).

Figure 10:
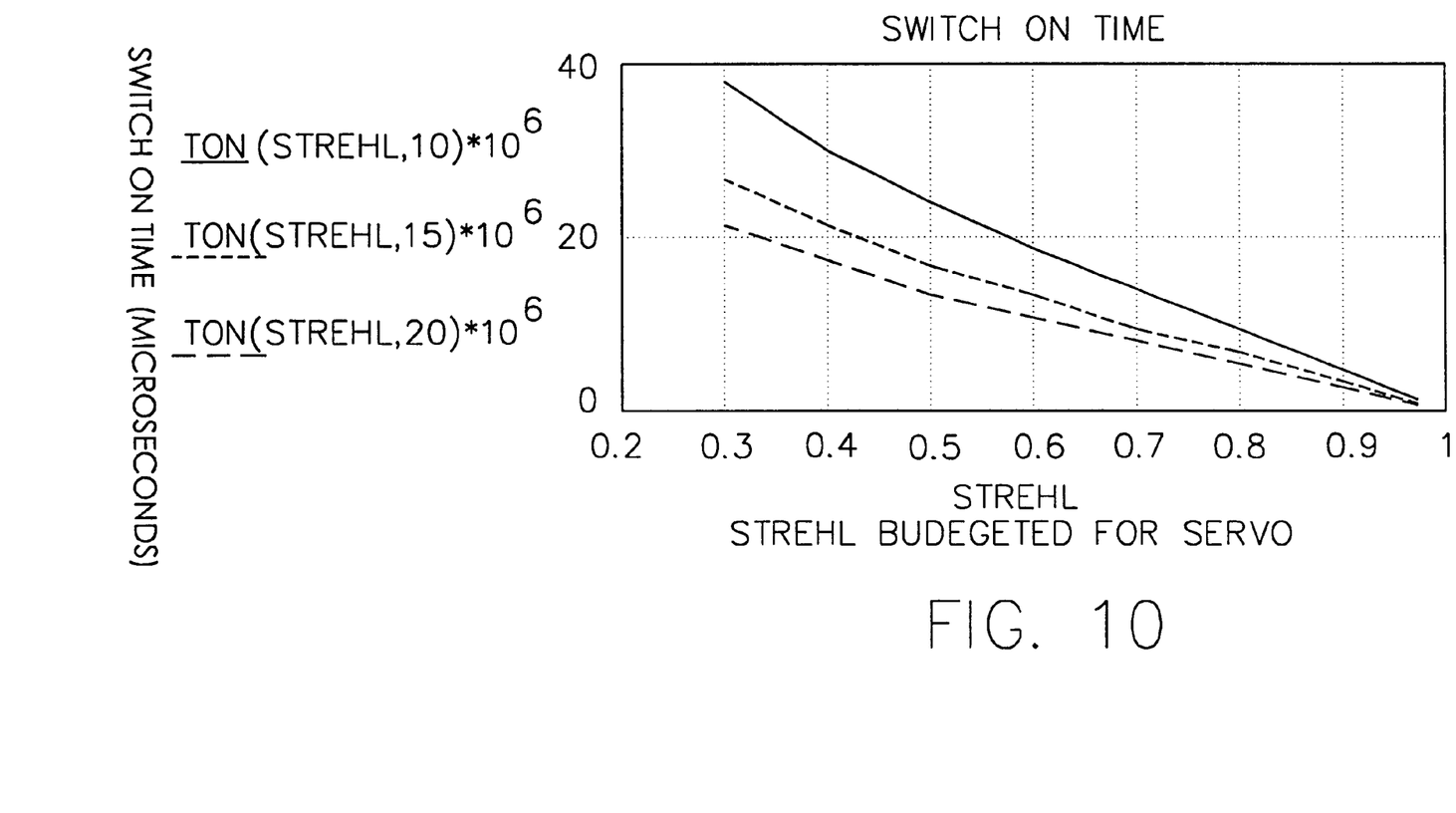
FIG. 10 is a graph of switch ON time vs. strehl values budgeted for servo for high bandwidth case, for sampling frequency/servo bandwidth=10, 15, 20.

For typical values of parameters, the variation of Ton as a function of strehl budgeted for servo is shown in FIG. 10.

This shows that for the high bandwidth case, the switch ON time is typically small, in the range of 10 to 20 microseconds.

The additional latency due to multiplexing is given by the additional delay in completing the drive for the last actuator multiplexed to the same drive amplifier.

Additional latency due to multiplexing is (N−1)*Ton where N is the number of actuators multiplexed to one drive amplifier.

Thus, we see that for N=2, the additional latency due to multiplexing is only about 10 to 20 microseconds, and is small, and for N=2 the number of drive amplifiers required is reduced by 50% compared to conventional one drive per actuator design. Even larger savings in drive amplifiers can be effected for larger N, if the increase in latency can be tolerated.

Figure 11:
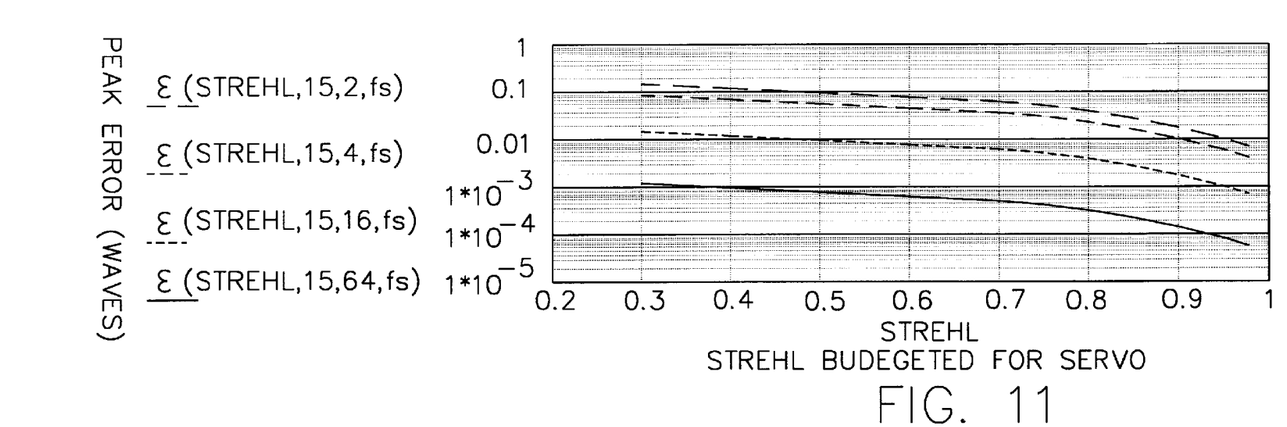
FIG. 11 is a graph of peak ripple error due to multiplexing vs. strehl budgeted for servo for low bandwidth case, for 2, 4, 16 and 64 actuators multiplexed to one drive amplifier.

The Number of Actuators that can be Multiplexed to one Drive Amplifier—for Low Bandwidth Case As mentioned earlier, for the low bandwidth case, a voltage drive can be used during switch ON time, as the sampling rate is very low, the charging time constant is small compared to sampling period, and the latency is not an issue. However, as the number of actuators multiplexed to one drive amplifier is increased to large values such as 256, the ripple error increases to non-negligible values. The peak ripple error in waves is shown in FIG. 11, for typical parameters for the low bandwidth case. Thus, the ripple error is small for a wide range of strehl budgeted for servo, for large number of actuators multiplexed to drive amplifier.

The Power Dissipation in the Switches

Figure 12:
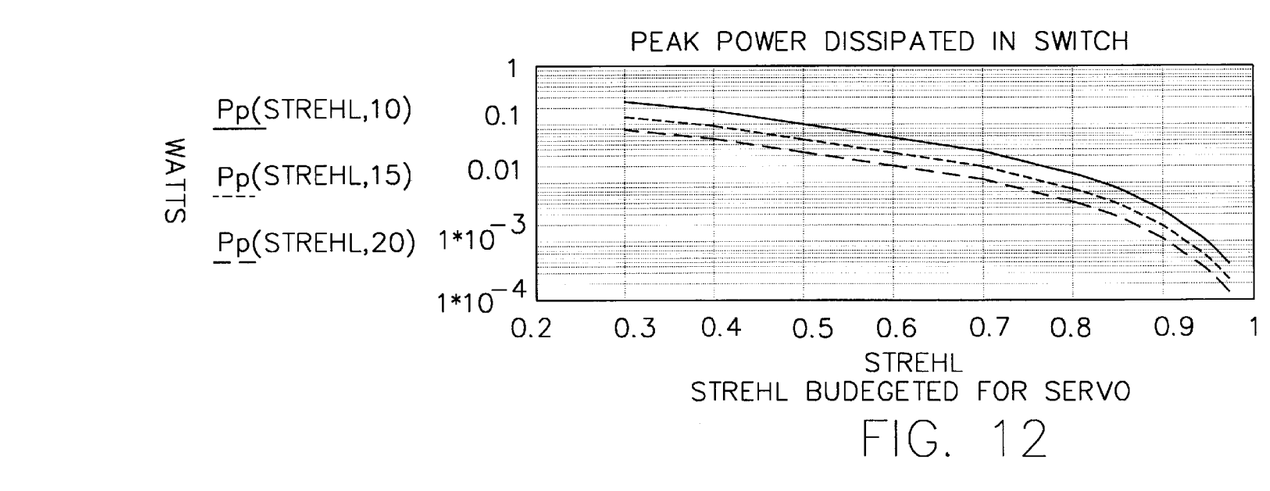
FIG. 12 is a graph of peak power dissipated in switch for low bandwidth case, for sampling rate/bandwidth=10, 15, 20.

For the typical parameters used in the examples, the peak and average power dissipated in the switches are shown below for the high bandwidth case, and in FIG. 12 for the low bandwidth case. This clearly shows that the power dissipation in the switches is extremely small.

For high bandwidth case, Peak Power=Ron*1 max$^2$;

For $R_{on}$=0.6 Θhm, 1 max=0.4 amp, Peak Power in only 0.096 watt.

The Impact of the Incremental Switched Drive Amplifier on the Actuator Design and Manufacture Process One direct impact on the actuator design and manufacture process is the stacked drive segments per actuator (see FIG. 9) for increasing stroke using multiplexed low voltage drive circuit.

Figure 13:
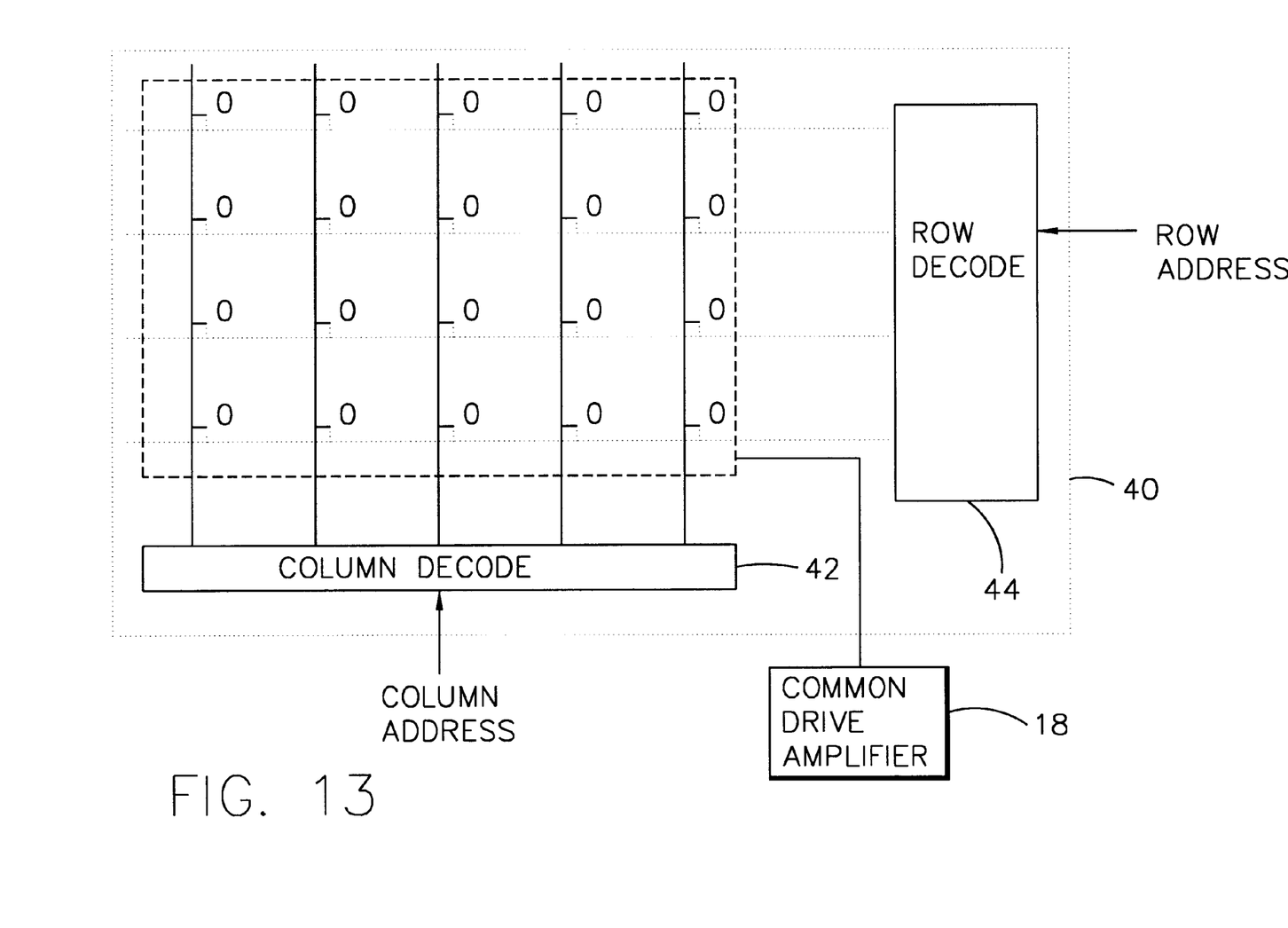
FIG. 13 is a rear view of a board showing actuator lead connections, for a grid interface to actuators.

The incremental switched drive amplifier described above can be used with any existing conventional actuator array design. However, there are applications where the number of actuators is very high (several thousand) wherein the conventional one drive amplifier per actuator design becomes extremely unwieldy and requires such large amounts of power and cable connections that it becomes practically impossible. In such cases, and in cases where the density of actuators is very high, the following two packaging methods and electrical interfaces solve the problem; (a) a grid interface and (b) wiring interface. The scope of this invention disclosure includes these two packaging and interface methods, and variations thereof. It should be understood that these methods can be used even for cases where the number of actuators is not high. (a) The Grid Interface Referring now to FIG. 13, it should be seen that the leads of each actuator (2n leads per actuator where n=number of drive segments stacked per actuator; n>1 typically for low bandwidth cases with large stroke requirements, see FIG. 7; n=1 otherwise) are brought straight down through holes in the electrically insulating base plate which also serves as a circuit board. On the back side of the circuit board 40 are the multiplexer switches which are surface-mounted along with the logic circuit for the level 0 multiplexers, such that the number of electrical connections to the board are significantly reduced, depending on the number of actuators (>2)

multiplexed to one drive amplifier. In the cases where the spatial density of actuators is so high that the components cannot be accommodated directly behind the actuators, the board is extended beyond the actuator grid to provide a substrate for components. For low bandwidth cases where large number of actuators are multiplexed to one drive amplifier, this interface also permits a design that provides (x,y) grid addressing of the actuators wherein a "X" or column driver 42 is provided and a "Y" or row driver 44 is provided.

In the limit of very high spatial density of actuators, this method approaches distributed actuation. This method also opens up new possibilities of actuator manufacturing process in a grid form instead of the existing methods in which typically actuators are manufactured in rows.

(b) The Wing Interface

Figure 14:
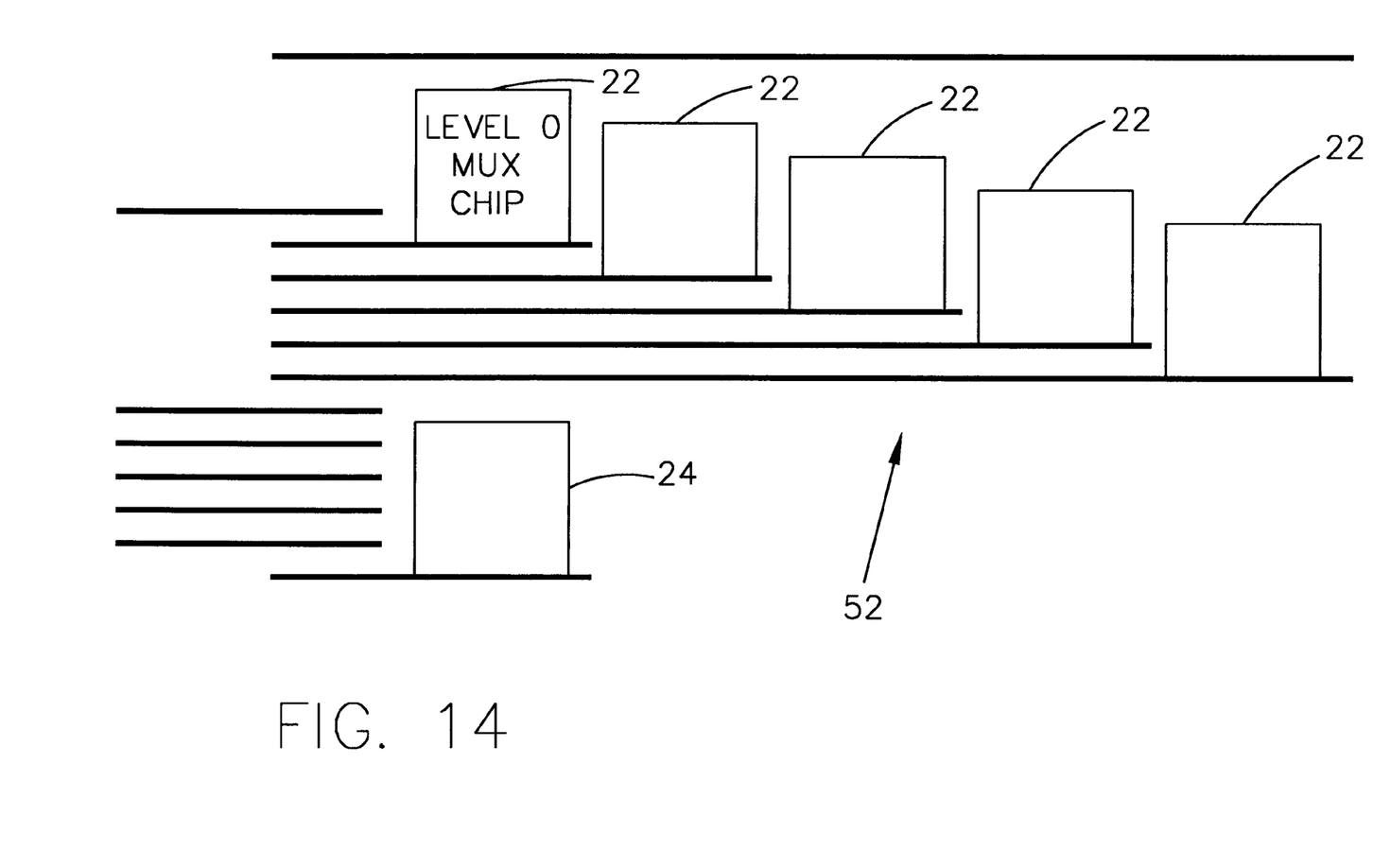
FIG. 14 shows schematically an example multiplexer chip

A wing interface is illustrated generally as 52 in FIG. 14. Leads 50 from all actuators in a given row are brought out to one side, alternating in sets of rows to left and right depending on the height of the multiplexer components. This method directly lends itself to be used with existing methods in which typically actuators are manufactured in rows.

In either method (a) or (b) above, the multiplexer components could be either commercially sold products or custom made, depending on the volume and cost constraints.

The Drive Control Processor

Figure 15:
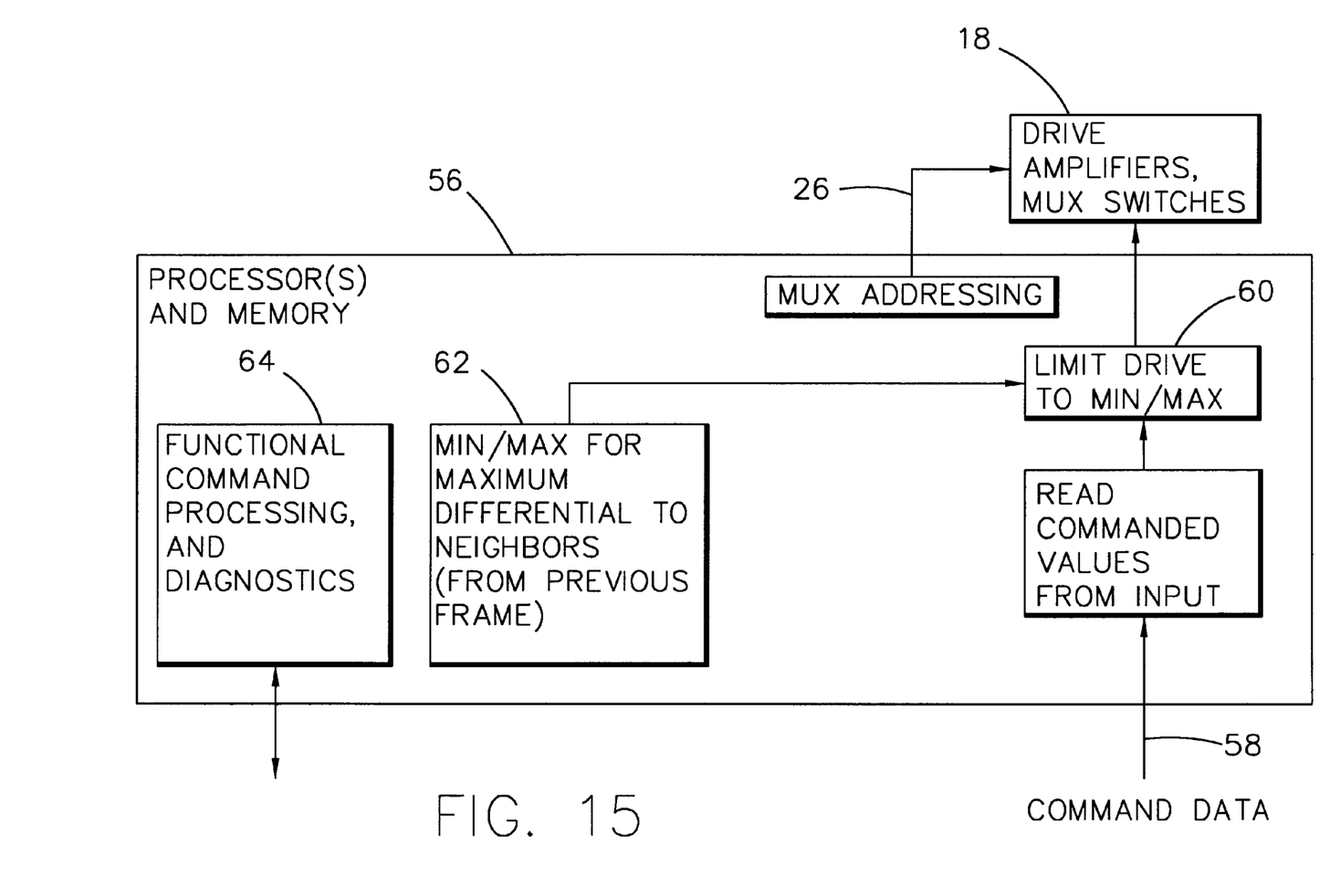
FIG. 15 shows schematically the processor of the scheme.

The drive control processor 56 is shown functionally in block diagram in FIG. 15, and performs as follows. Interface with the user is accomplished via input 58. Once drive command vector is received from the input, for the current frame in digital form, limits are applied 60 depending on differential stroke limitation of the DM [see item (c) below]. Thereafter, the commands are sent to each drive amplifier in sequence for each of that actuator that is multiplexed to that drive amplifier, along with the corresponding multiplexer address values.

At location 62, a monitor is made (at a relatively low rate, once in several frames) of the differential stroke between actuators and set the drive limits that affect the drive command issued to actuator. Also, at location 64, diagnostic measurements of drive signals are made through the diagnostic multiplexer and A/D. It is, possible to use this feature to not only monitor selected channels in real-time, since the multiplexer switches are bidirectional, but also to perform off-line diagnostic tests in which any actuator can be checked for leakage, etc.

Thus, the invention takes advantage of a very important fact in practically all deformable mirror (DM) applications, which is that the incremental drive required in one sample period is only a small part of the full stroke of the DM. Also, the use of switched drive speeds up drive compared to continuous drive.

What is claimed is:

1. A method of driving a plurality of actuators comprising the steps of: providing a plurality of actuators;

providing a controller having drive output signals for driving said plurality of actuators;

providing a drive amplifier between said plurality of actuators and said controller;

providing at least one multiplexer between said drive amplifier and said plurality of actuators;

driving said actuators through said drive amplifier and at least one multiplexer in a stepwise continuous drive using said controller drive output signals by causing said actuators to be energized and deenergized by multiplexing through said at least one multiplexer.

2. A method as defined in claim 1 further characterized by providing a comparator as part of said drive amplifier and using same as a switch.

3. A method as defined in claim 2 further characterized by said plurality of actuators being a arranged in an array and being piezoelectric type actuators.

4. A method as defined in claim 1 further characterized by providing said controller with a limit drive min/max function.

5. A method as defined in claim 4 further characterized by providing said controller with a monitoring function and causing a differential stroke between actuators.

6. A method as defined in claim 5 further characterized by locating said plurality of actuators on one side of a board and mounting a plurality of multiplexers on the other side of said board in a wing like configuration.

7. A method as defined in claim 4 further characterized by arranging said multiplexers in a stacked arrangement.

8. A deformable mirror drive system comprising:

an array of actuators coupleable to said deformable mirror in a grid configuration for altering the shape of said mirror, each actuator of said array having a stroke through which to move a preassigned grid portion of said mirror, each actuator having an address and controllable by time sampled signals;

a controller;

a plurality of drive amplifiers coupled to said controller;

a multiplexer coupled between each drive amplifier and a predetermined number of actuators;

said controller for generating for each drive amplifier and corresponding multiplexer an actuator address for each of the actuators of said multiplexer and corresponding drive signals in a time sampled data sequence, each drive amplifier being driven by said time sampled drive signals to effect time sampled output signals, each multiplexer being controlled by said time sampled actuator addresses to route said time sampled output signals of the corresponding drive amplifier to the actuators corresponding to the time sampled actuator addresses, each of said time sampled output signals controlling movement of the actuators through a relatively small increment of the stroke thereof.

9. The drive system of claim 8 wherein the controller is operative in accordance with a drive update frequency for altering the shape of the deformable mirror.

10. The drive system of claim 8 wherein the drive amplifiers include a comparator circuit coupled thereto for controlling the operation thereof.

11. The drive system of claim 8 wherein each actuator of the array comprises a piezoelectric actuator.

12. The drive system of claim 8 wherein each actuator of the array comprises a charge storage element for developing a voltage to control the movement of the actuator to a position along the stroke thereof; said time sampled output signals incrementally controlling the charge of the storage element to effect the relatively small incremental movement of the actuator.

13. The drive system of claim 12 wherein each drive amplifier is operative to generate a time sampled high current output signal to incrementally control the charge of the storage element in a short time increment.

14. The drive system of claim 13 wherein the short time increment is in the range of 10 to 20 microseconds.

15. The drive system of claim 13 wherein each drive amplifier comprises a switched drive amplifier.

16. The drive system of claim 8 wherein the controller is responsive to drive commands to generate the drive signals.

17. The drive system of claim 16 wherein the controller includes a function to limit the generated drive signals in response to the drive commands to effect a differential incremental movement between adjacent actuators to predetermined maximum and minimum differentials.

* * * * *